United States Patent [19]

Hayafuji et al.

[11] Patent Number: 5,701,321
[45] Date of Patent: Dec. 23, 1997

[54] SEMICONDUCTOR LASER PRODUCING SHORT WAVELENGTH LIGHT

[75] Inventors: Norio Hayafuji; Zempei Kawazu, both of Itami, Japan

[73] Assignee: Mitsubishi Denki Kabushiki Kaisha, Tokyo, Japan

[21] Appl. No.: 623,378

[22] Filed: Mar. 28, 1996

[30] Foreign Application Priority Data

Apr. 28, 1995 [JP] Japan .................. 7-105763

[51] Int. Cl.$^6$ .................. H01S 3/19; H01S 3/08
[52] U.S. Cl. .................. 372/44; 372/45; 372/46; 372/96
[58] Field of Search .................. 372/44, 46, 96, 372/98, 45; 257/98, 99, 100, 707, 352

[56] References Cited

U.S. PATENT DOCUMENTS

| | | | |
|---|---|---|---|
| 5,034,954 | 7/1991 | Seiwa | 372/45 |
| 5,038,356 | 8/1991 | Botez et al. | 372/45 |
| 5,073,892 | 12/1991 | Uomi et al. | 372/46 |
| 5,146,465 | 9/1992 | Khan et al. | 372/45 |
| 5,314,838 | 5/1994 | Cho et al. | 372/45 |

FOREIGN PATENT DOCUMENTS

| | | |
|---|---|---|
| 0488510 | 6/1992 | European Pat. Off. . |
| 58-033888 | 2/1983 | Japan . |
| 63-142861 | 6/1988 | Japan . |
| 2168689 | 6/1990 | Japan . |
| 2271682 | 11/1990 | Japan . |
| 6244506 | 9/1994 | Japan . |

OTHER PUBLICATIONS

"Fundamental Examination Of GaN-type Surface Light-Emitting Laser", Nitride Semiconductor Seminar, 1994, pp. 55-60 (Dec. 1994).
"Realization Of An High Luminance Blue Light-Emitting Diode", Nikkei Science Journal, vol. 10, 1994, pp. 44-55.

*Primary Examiner*—Rodney B. Bovernick
*Assistant Examiner*—Luong-Quyen T. Phan
*Attorney, Agent, or Firm*—Leydig, Voit & Mayer, Ltd.

[57] ABSTRACT

A semiconductor laser includes an electrically insulating substrate having an opening; a first conductivity type first contact layer within the opening; a laminated semiconductor layer structure on the first contact layer and comprising a first cladding layer, an active layer, a second cladding layer, and a second contact layer wherein the first contact layer includes an aperture within the opening; a first electrode disposed on the electrically insulating substrate and extending to and contacting the first contact layer; and a second electrode in electrical contact with the second contact layer. The substrate is preferably sapphire, MgO, and spinel and the semiconductor layers are preferably GaN materials so that the laser emits short wavelength light. An electrode makes direct, reliable contact to the first cladding layer through an opening in the electrically insulating substrate without the need of mechanically working or etching the substrate.

13 Claims, 8 Drawing Sheets

SEMICONDUCTOR LASER PRODUCING SHORT WAVELENGTH LIGHT

FIELD OF THE INVENTION

This invention relates to a semiconductor laser producing short wavelength light, i.e., having wavelengths ranging from ultraviolet to green, and a method of manufacturing the semiconductor laser.

BACKGROUND ART

Semiconductor lasers including GaN materials, i.e., compound semiconductors including at least Ga and N as constituents, generate short wavelength light. Progress in the epitaxial growth of III–V semiconductor materials including a nitride on sapphire substrates has produced commercial light emitting diodes that emit blue light. For example, a GaInN/AlGaN double heterojunction diode including a sapphire substrate grown by metal organic chemical vapor deposition (MOCVD) was reported in the October 1994 issue of *Nikkei Science Journal* at pages 44–55.

FIG. 8 is a cross-sectional view of the structure of a conventional GaAs semiconductor laser. The semiconductor laser shown in FIG. 8 includes an n-type GaAs substrate 21 on which are successively disposed an n-type GaAs buffer layer 22, an n-type AlGaAs cladding layer 23, an undoped GaAs active layer 24, a p-type AlGaAs cladding layer 25, an n-type GaAs current blocking layer 26, and a p-type GaAs contact layer 27. Laser light is generated in a region including parts of the n-type cladding layer 23, the active layer 24, the p-type cladding layer 25, and the contact layer 27. An optical resonator structure is formed between a front light reflecting film 28 disposed on the n-type cladding layer 23 and a rear light reflecting film 29 disposed on the contact layer 27. A first electrode 30 is disposed on the substrate 21 and a second electrode 31 is disposed on the contact layer 27. Laser light generated within the semiconductor laser is emitted through an opening 32 that penetrates through part of the substrate 21 and the buffer layer 22 to expose part of the n-type cladding layer 23 where the front reflecting light film 28 is disposed.

FIG. 9 is a cross-sectional view of another conventional semiconductor laser structure. The semiconductor laser of FIG. 9 includes an n-type GaAs substrate 21 on which are successively disposed an n-type GaAs buffer layer 22, an n-type AlGaAs cladding layer 23, an undoped GaAs active layer 24, a p-type AlGaAs cladding layer 25, and a p-type GaAs contact layer 26. In this structure, a front light reflecting film 28 and a rear light reflecting film 29 are disposed on opposed surfaces formed by cleaving the laminated layer structure. Unlike the semiconductor laser of FIG. 8, in the semiconductor laser of FIG. 9, the front and rear light reflecting films 28 and 29 each contact several of the semiconductor layers. A first electrode 30 is disposed on the substrate 21 and a second electrode 31 is disposed on the contact layer 26. Light generated within the active layer 24 resonates between the front and rear light reflecting films 28 and 29 and, when sufficient current flows between the electrodes 30 and 31, laser light that is emitted through the front light reflecting film 28 is produced.

When the semiconductor laser structures of FIGS. 8 and 9 are modified to use a sapphire substrate and GaN materials in place of the GaAs materials, a semiconductor laser is produced that generates short wavelength light, i.e., light having wavelengths ranging from ultraviolet to green. In those structures, the active layer 24 is undoped GaInN disposed between n-type and p-type AlGaN cladding layers.

Although progress in growing high quality crystalline GaN materials on sapphire substrates has been dramatic, it is still difficult to produce a semiconductor laser generating short wavelength light simply by replacing the GaAs materials in the structures of FIGS. 8 and 9 with GaN materials. When sapphire is used as the substrate, since it is an electrically insulating material, an electrode, like electrode 30 of FIGS. 8 and 9, disposed on the substrate, does not provide an electrical connection to the double heterojunction structure, i.e., the cladding layers and the active layer, for producing laser light. In addition, there are processing problems in using a sapphire substrate and GaN materials. When those materials are used in an attempt to produce the structure of FIG. 8, after the layers 22–26 are deposited on the sapphire substrate 21, it is difficult to form the opening 32 extending to the n-type cladding layer 23. Etching a sapphire substrate to form that opening is difficult and controlling the depth of the opening is also difficult. For example, the opening may undesirably extend as far as the active layer 24 and even to the p-type cladding layer 25, producing a useless device and resulting in a low production yield.

When GaN materials and a sapphire substrate are employed in the semiconductor laser structure of FIG. 9, it is difficult to form the facets of the semiconductor laser because sapphire and GaN materials are difficult to cleave. Thus, it may be impossible to produce facets having sufficient optical characteristics to ensure operation of the semiconductor laser.

SUMMARY OF THE INVENTION

It is an object of the present invention to provide a high performance semiconductor laser producing short wavelength light and a method of manufacturing the laser.

It is another object of the invention to provide a high performance semiconductor laser producing short wavelength light and having an exposed contact layer for connection of an electrode and that is at least partially embedded in a substrate.

It is a further object of the invention to provide a high performance semiconductor laser producing short wavelength light and including a contact layer having an exposed surface that is continuous and flush with a substrate for easy and reliable connection of an electrode.

It is another object of the invention to provide a high performance semiconductor laser producing short wavelength light and including a contact layer having an exposed surface that is continuous with a substrate for connection of an electrode to the contact layer.

It is yet another object of the invention to provide a high performance semiconductor laser producing short wavelength light and including semiconductor layers having side surfaces perpendicular to the thicknesses of the semiconductor layers and covered by part of a substrate so that current flow can be excluded from certain regions of the semiconductor laser.

It is a still further object of the invention to provide a high performance semiconductor laser producing short wavelength light wherein the substrate has an opening through which part of a contact layer is exposed and including an electrode connected to the contact layer in the opening.

A semiconductor laser according to one aspect of the invention includes an electrically insulating substrate having an opening; a first conductivity type semiconductor first contact layer disposed within the opening in the electrically insulating substrate, contacting the electrically insulating substrate, and having an externally exposed surface; a laminated semiconductor layer structure disposed on the first contact layer and comprising, successively disposed, a first conductivity type semiconductor first cladding layer, a semiconductor active layer, a second conductivity type semiconductor second cladding layer, and a second conductivity type semiconductor second contact layer wherein the first contact layer includes an aperture within the opening in the electrically insulating substrate in which a surface of the first cladding layer is exposed; a first light reflecting layer disposed on the surface of the first cladding layer exposed in the aperture; a second light reflecting layer disposed on the second contact layer opposite the first light reflecting layer; a first electrode disposed on the electrically insulating substrate and extending to and contacting the first contact layer; and a second electrode in electrical contact with the second contact layer.

A semiconductor laser according to a second aspect of the invention includes an electrically insulating substrate having an opening; a first conductivity type semiconductor first contact layer disposed on and contacting the electrically insulating substrate; a laminated semiconductor layer structure disposed on the first contact layer and comprising, successively disposed, a first conductivity type semiconductor first cladding layer, a semiconductor active layer, a second conductivity type semiconductor second cladding layer, a first conductivity type semiconductor current blocking layer having a central opening filled by part of the second cladding layer, the opening being disposed opposite the opening in the electrically insulating substrate, and a second conductivity type second contact layer wherein the first contact layer includes an aperture within the opening in the electrically insulating substrate in which the first cladding layer is exposed; a first light reflecting layer disposed on the first cladding layer in the aperture in the first contact layer; a second light reflecting layer disposed on the second contact layer opposite the first light reflecting layer; a first electrode disposed on the electrically insulating substrate in the opening and extending to and contacting the first contact layer in the aperture; and a second electrode disposed on and contacting the second contact layer.

A method of making a semiconductor laser according to the invention includes forming a recess in an electrically insulating substrate at a front surface of the electrically insulating substrate opposite a rear surface of the electrically insulating substrate; growing a crystalline first conductivity type first semiconductor layer in the recess; successively epitaxially growing on the first semiconductor layer, a first conductivity type semiconductor first cladding layer, a semiconductor active layer, and a second conductivity type semiconductor second cladding layer; removing part of the electrically insulating substrate from the rear surface to expose the first semiconductor layer; and forming an aperture penetrating through part of the first semiconductor layer, exposing the first cladding layer.

Most preferably, the semiconductor layers are GaN materials and the electrically insulating substrate is sapphire, MgO, or spinel.

Other objects and advantages of this invention will become apparent from the detailed description that follows. It should be understood, however, that the detailed description and specific embodiments are provided for illustration only since various additions and modifications within the spirit and scope of the invention will become apparent to those skilled in the art from this disclosure.

BRIEF DESCRIPTION OF THE DRAWINGS

In all figures, the same and substantially the same elements are given the same reference numbers.

DESCRIPTION OF PREFERRED EMBODIMENTS

Figure 1:
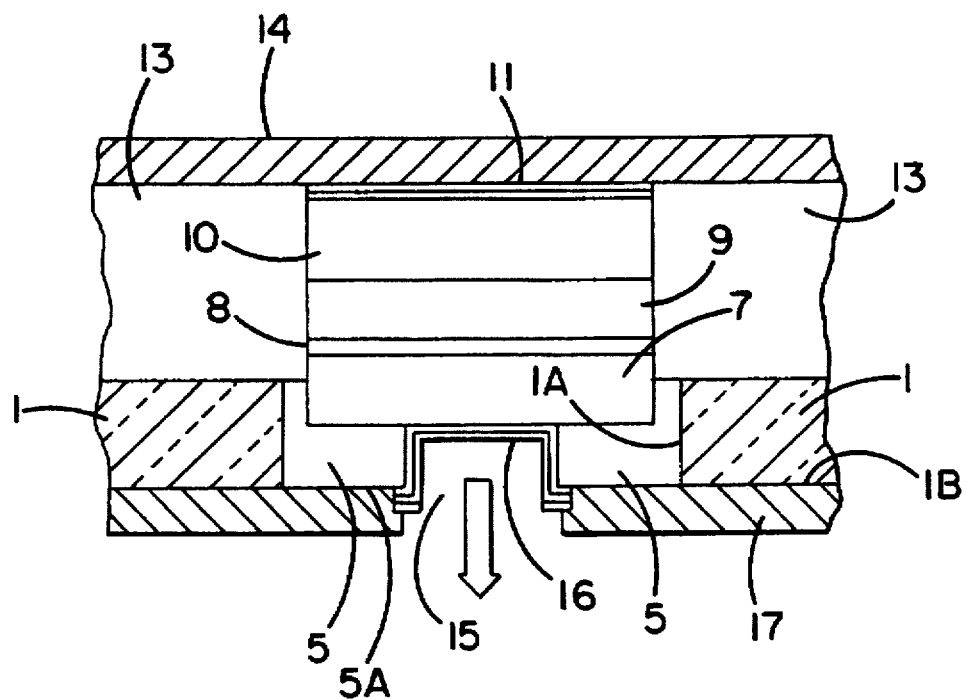
FIG. 1 is a cross-sectional view of a semiconductor laser structure according to a first embodiment of the present invention.

FIG. 1 is a cross-sectional view of a semiconductor laser structure according to a first embodiment of the present invention. The semiconductor laser of FIG. 1 includes a sapphire substrate 1 having a central opening 1A. An n-type GaN contact layer 5 is disposed within the opening 1A in contact with the inside surface of that opening 1A in the sapphire substrate 1. The contact layer 5 includes a planar surface 5A that is substantially flush with a planar surface 1B of the sapphire substrate 1, a surface that is transverse to the inside surface of the opening 1A. In other words, the sapphire substrate 1 and the contact layer 5 have substantially the same thickness. Layers of GaN materials are successively disposed on the contact layer 5, including an n-type AlGaN cladding layer 7, an undoped GaInN active layer 8, a p-type AlGaN cladding layer 9, and a p-type GaN contact layer 10. Further, a p-type semiconductor rear light reflecting layer 11 including films of one or more materials, such as AlN or AlGaN, is disposed on the contact layer 10. These layers 7-11 are successively epitaxially grown on the contact layer 5 and form a cylindrical shape in plan view. The active layer 8 and the cladding layers 7 and 9 form a double heterojunction structure.

An insulating film 13 is disposed on the sapphire substrate 1 surrounding and contacting side surfaces of the epitaxially grown layers 7-11. In the embodiment of FIG. 1, the contact layer 5 includes a recess in which a portion of the n-type cladding layer 7 is disposed with part of a side surface of that n-type cladding layer 7 in contact with the contact layer 5. The insulating film 13 functions as a current blocking layer to confine current flow to the epitaxially grown layers. A second electrode 14, making an ohmic contact, is disposed on the insulating layer 13 and the rear light reflecting layer 11. Preferably, the insulating layer 13 and the rear light reflecting layer 11 have substantially coplanar surfaces on which the electrode 14 is disposed to establish an electrical contact to the semiconductor laser.

At the opposite side of the structure, an aperture 15 extends through part of the contact layer 5 to and exposing part of the n-type cladding layer 7 through the opening 1A. A front light reflecting layer 16 is deposited in the aperture 15, covering the exposed part of the n-type cladding layer 7. The front light reflecting layer 16 typically includes one or more dielectric films, such as ZrO and $SiO_2$. A first electrode 17 is disposed on the substantially coplanar surfaces of the sapphire substrate 1 and the contact layer 5 to establish a second ohmic contact to the semiconductor laser.

When a voltage is applied between the electrodes 14 and 17, forward biasing the semiconductor laser, and sufficient current flows between those electrodes to exceed a threshold current, the light generated within the semiconductor laser resonates between the rear and front light reflecting layers 11 and 16 and part of the light is emitted as a laser beam through the aperture 15 and the opening 1A in the direction of the arrow in FIG. 1. The light produced has a relatively short wavelength, i.e., in a range from ultraviolet to green, since GaN materials are employed in this semiconductor laser.

Since the substrate 1 is sapphire, an electrically insulating material, it has been difficult to connect an electrode disposed on the insulating substrate to a contact layer. However, in the embodiment of the invention illustrated in FIG. 1, the contact layer 5 is exposed on the substantially coplanar surfaces of the substrate 1 and the contact layer 5, i.e., surfaces 1B and 5A, so that a reliable electrical connection to the contact layer 5 at the surface 5A is easily made.

Figure 2A:
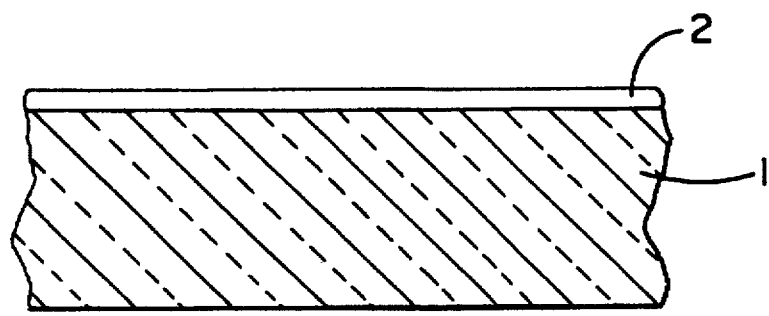
FIGS. 2(a)-2(l) are cross-sectional views illustrating steps in a method of manufacturing the semiconductor laser of FIG. 1.
Figure 2B:
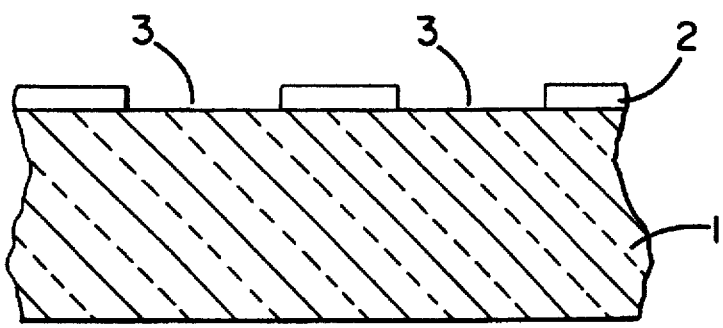
Figure 2C:
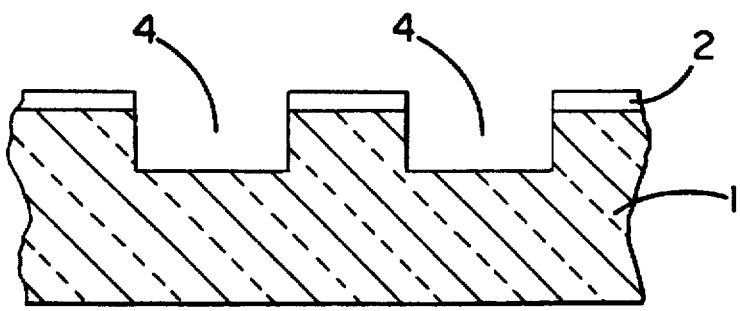

A method of manufacturing the semiconductor laser of FIG. 1 is described with respect to FIGS. 2(a)–2(l). Initially, as shown in FIG. 2(a), a protective film 2, such as $SiO_2$, is deposited on the surface of a sapphire substrate 1, which may be two to three inches in diameter and six hundred microns thick, to a thickness of one hundred nanometers. Then, as shown in FIG. 2(b), parts of the protective film 2 are removed, leaving areas 3 of the sapphire substrate 1 exposed. The areas 3 may be circular in plan view and about twenty microns in diameter. Using the remaining parts of the protective film 2 as an etching mask, the exposed areas 3 of the sapphire substrate 1 are selectively etched, as shown in FIG. 2(c), to produce recesses 4 having a depth of approximately ten microns. The sapphire substrate 1 is etched with a mixture of phosphoric and sulfuric acids heated to about 200° C.

Figure 2D:
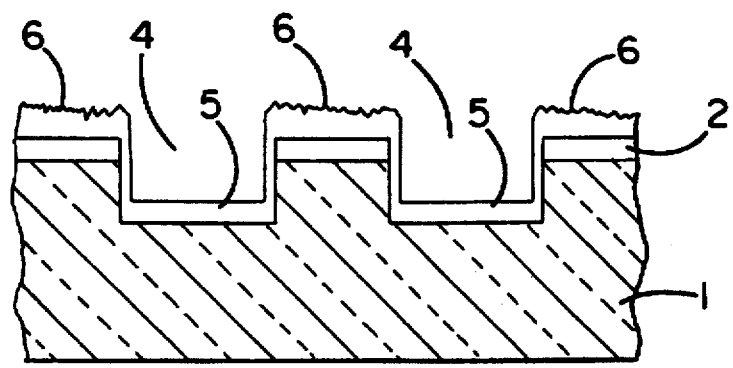
Figure 2E:
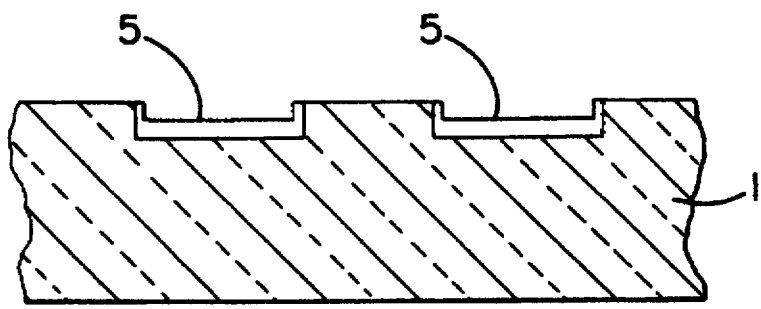

As illustrated in FIG. 2(d), an n-type GaN layer is directly grown on the surface of the substrate 1 in the recesses 4 using a two step technique based upon the MOCVD process. First, polycrystalline GaN is grown while the substrate 1 is held at a temperature between 500° C. and 600° C. Thereafter, a second layer of GaN is grown with the temperature of the substrate raised to about 1000° C. This two step method produces a layer of high quality single crystal n-type GaN 5 directly on the sapphire substrate 1 in the recesses 4 and a layer of polycrystalline GaN 6 on the remaining of the protective film 2 outside of the recesses 4, as indicated in FIG. 2(d). The polycrystalline GaN layer 6 is electrically insulating. The polycrystalline GaN layer 6 is removed by mechanically lapping the substrate at the grown layer side until the polycrystalline GaN and the remaining parts of the protective film 2 are removed. The structure remaining after the lapping step is shown in FIG. 2(e).

Figure 2F:
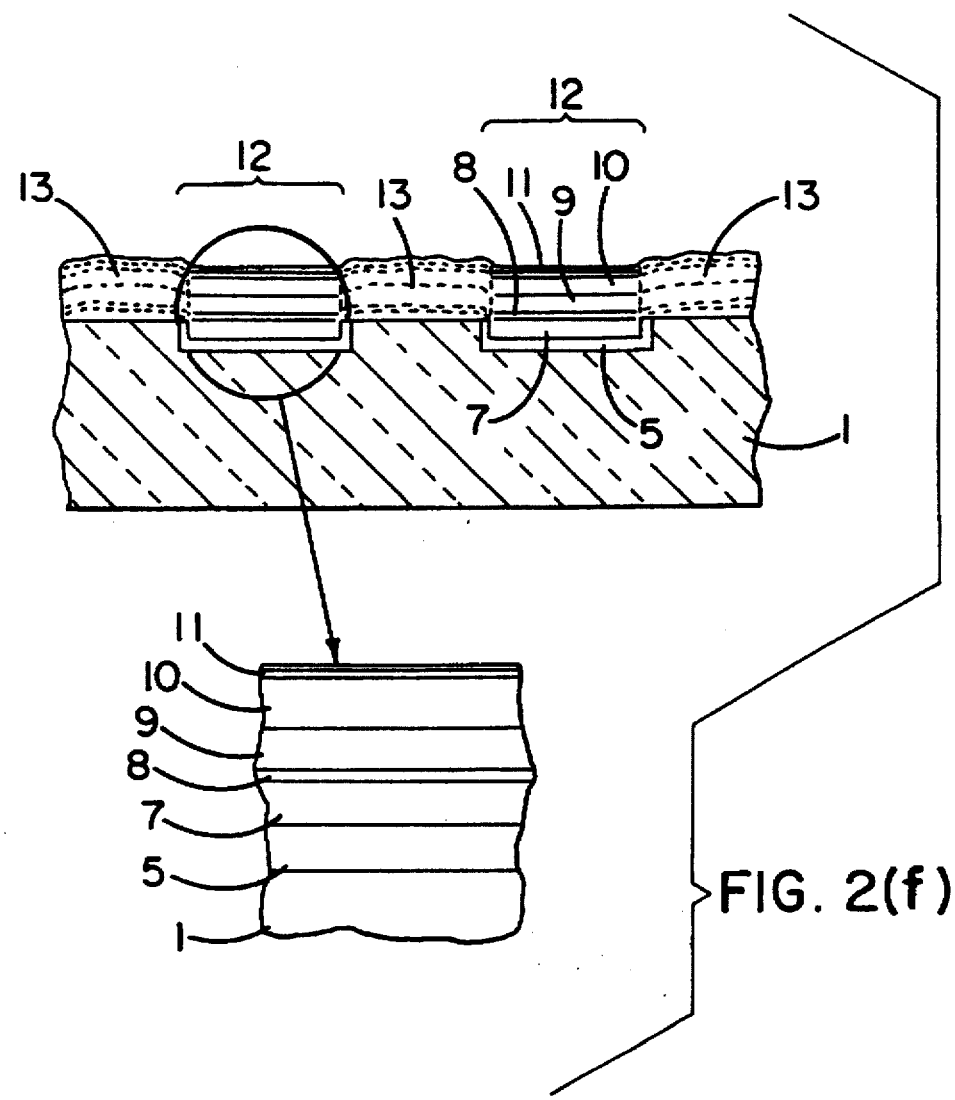

Following the removal of the polycrystalline GaN and the remaining protective film 2, the n-type AlGaN cladding layer 7, the undoped GaInN active layer 8, the p-type AlGaN cladding layer 9, and the p-type GaN contact layer 10 are successively epitaxially grown while the sapphire substrate 1 is at a temperature of 800° C. to 1000° C. Thereafter, the light reflecting layer 11, which preferably includes multiple films of AlN and AlGaN, is epitaxially grown on the contact layer 10, preferably by the MOCVD process. Preferably, the light reflecting layer 11 comprising multiple layers of different materials forms a distributed Bragg reflector (DBR). In these epitaxial growth steps, high quality single crystal GaN materials are grown on and opposite the monocrystalline contact layer 5 in regions 12. In regions 13 where the sapphire substrate 1 is directly exposed, i.e., between adjacent recesses 4, high resistance polycrystalline insulating layers are deposited, as illustrated in FIG. 2(f).

Figure 2G:
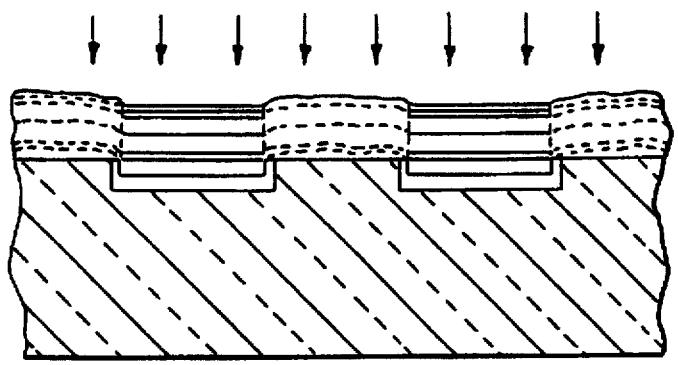
Figure 2H:
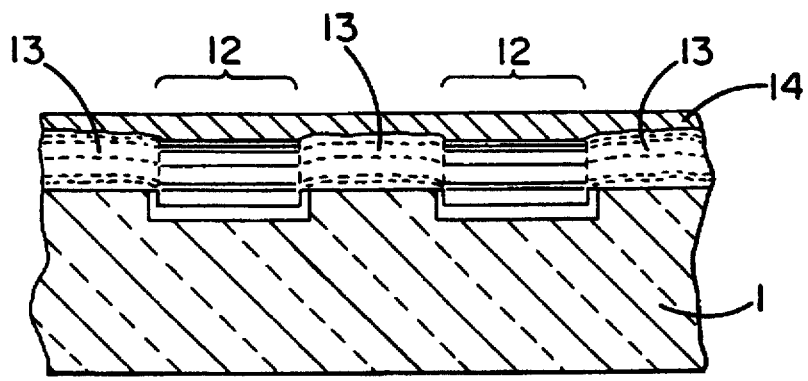

The regions 12 including the epitaxial layers are annealed or subjected to electron beam radiation of sufficient energy to reach the p-type cladding layer 9 so that a good quality ohmic contact layer can be formed on the light reflecting layer 11. Following this process, which is illustrated in FIG. 2(g), a metal layer forming electrodes 14 is deposited on the regions 12 as well as on the regions 13, as depicted in FIG. 2(h).

Figure 2I:
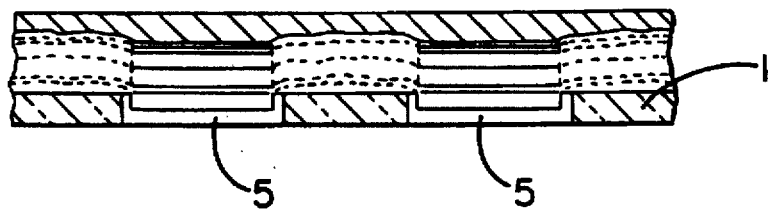
Figure 2J:
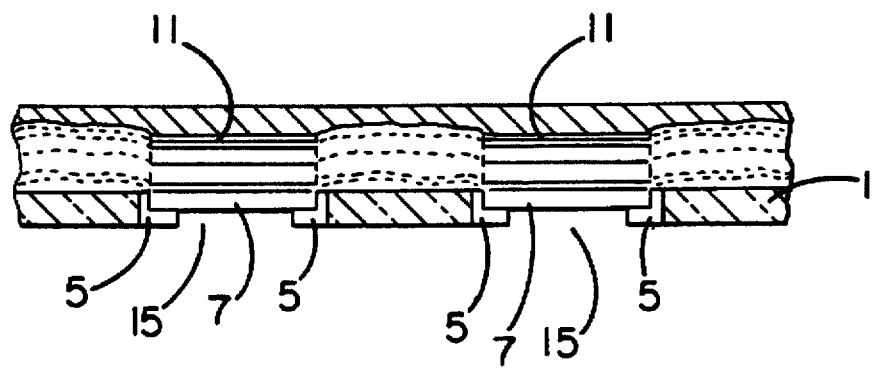

Then, the sapphire substrate 1 is mechanically lapped and chemically etched at the rear surface until the contact layer 5 is exposed, as illustrated in FIG. 2(i). A central portion of the contact layer 5 opposite each of the regions 12 is selectively removed. That removal leaves a peripheral region of the contact layer 5 in contact with and connected to the sapphire substrate 1, as shown in FIG. 2(j). This step produces the apertures 15 through which laser light is emitted in the completed semiconductor lasers. When the epitaxially grown layers of the regions 12 and the contact layer 5, as originally formed, are circular in plan view, the remaining portions of each of the contact layer 5 are annular. Because the apertures 15 are formed in semiconductor layers, namely, the contact layer 5, the apertures can be formed relatively easily, for example, by masking and etching, eliminating the necessity of processing the sapphire substrate 1 mechanically or chemically, processing which is difficult because sapphire is relatively inert and very hard.

Figure 2K:
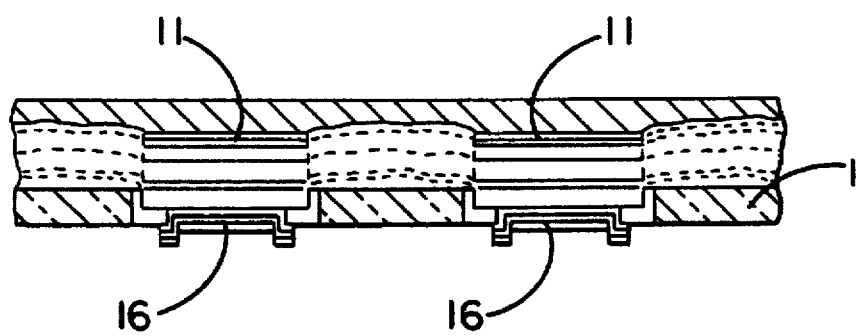
Figure 2L:
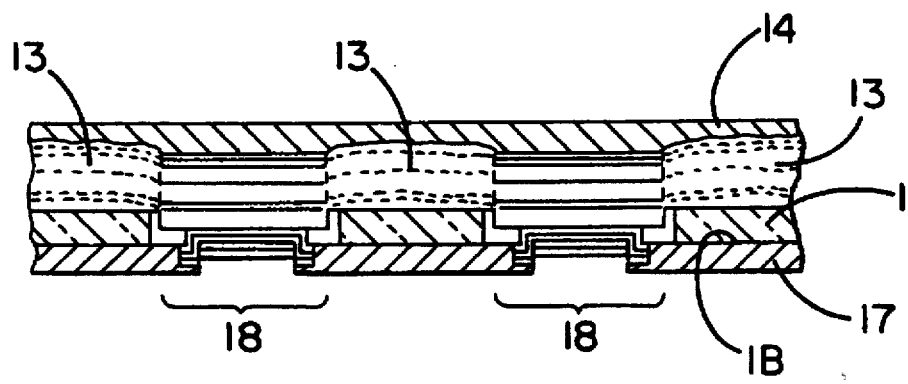

The semiconductor laser is completed in final processing steps that include depositing the front light reflecting layer 16 that includes multiple films of ZrO and $SiO_2$ over the surface of the n-type cladding layer 7 that has been exposed through the aperture 15. The front light reflecting layer 16 is patterned, as shown in FIG. 2(k), so that some of the contact layer 5 remains exposed for establishing an electrical contact to each semiconductor laser. That electrical contact is made by depositing a metal layer 17 on the entire surface, with the exception of the front light reflecting layer 16 which may be masked during the deposition of that electrode layer. Since the contact layer 5 is substantially flush with the lapped and etched surface of the sapphire substrate 1, the electrode 17 reliably contacts the exposed part of the contact layer 5, completing the formation of an array of semiconductor laser regions 18, each including a semiconductor laser according to the first embodiment of the invention. Each semiconductor laser produces light having wavelengths ranging from ultraviolet to green which has or is expected to find use in animation, defense application, and information communication.

Figure 3:
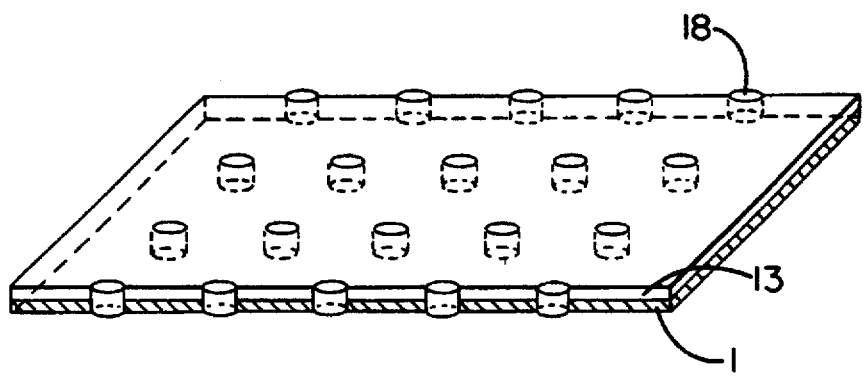
FIG. 3 is a perspective view of an integrated semiconductor laser array employing semiconductor lasers according to the embodiment of FIG. 1.

As schematically indicated in FIGS. 2(b)–2(l), the manufacturing steps described produce an array of semiconductor lasers, such as illustrated in FIG. 3. The array includes a plurality of semiconductor laser regions 18 arranged in a two-dimensional matrix. By arranging the electrodes on opposite sides of the array structure, independently contacting the respective semiconductor lasers, the semiconductor lasers can be operated individually or in groups of two or more, easily achieving monolithic integration on a single chip of a plurality of semiconductor lasers producing short wavelength light. The inherent strength of the sapphire substrate 1 ensures good mechanical and handling characteristics for the array and good heat dissipation characteristics for the semiconductor lasers, avoiding abnormal laser oscillation due to temperature variations.

While the epitaxially grown layers 7-11 of the semiconductor laser structure of FIG. 1 were described as having a cylindrical shape in plan, the structure is not limited to such a geometry and the layers can have any shape in plan, such as a square or rectangular shape, provided the epitaxially grown layers are, in plan, directly opposite the contact layer 5. Likewise, the substrate 1 is not limited to sapphire but maybe other insulating materials, such as MgO and spinel ($MgAl_2O_4$). In the process step depicted in FIGS. 2(h) and 2(i), the sapphire substrate 1 may be reduced in thickness exclusively by lapping, without the use of chemical etching, to expose the contact layer 5 so that the layer 5 is substantially flush, i.e., coplanar, with the surface of the sapphire substrate 1.

In the structure of FIG. 1, the surface of the n-type cladding layer 7 on which the front light reflecting layer 16 is disposed is located between the front and rear surfaces of the sapphire substrate 1. The location of that surface relative to the surfaces of the sapphire substrate depends upon how much of the sapphire substrate 1 is removed in the step illustrated in FIG. 2(e). More of the sapphire substrate 1 can be removed than indicated in FIG. 2(e) with the result that the surface of the n-type cladding layer 7 forming the front facet of the semiconductor laser may be coplanar with or substantially coplanar with the surface 1B of the sapphire substrate on which the electrode 17 is disposed by modifying the steps illustrated in FIGS. 2(i) and 2(j). In that modification, more of the sapphire substrate 1 is removed than indicated in FIG. 2(j) so that little, if any, of the contact layer 5 is left present on the front surface of the n-type cladding layer 7.

Although not illustrated, the surfaces of the contact layer 5 and the sapphire substrate 1 on which the electrode 17 is disposed need not be coplanar. Those surfaces may, for example, be parallel with a discontinuity between them, i.e., with the contact layer 5 projecting from or being recessed with respect to the surface 1B of the sapphire substrate 1.

Figure 4:
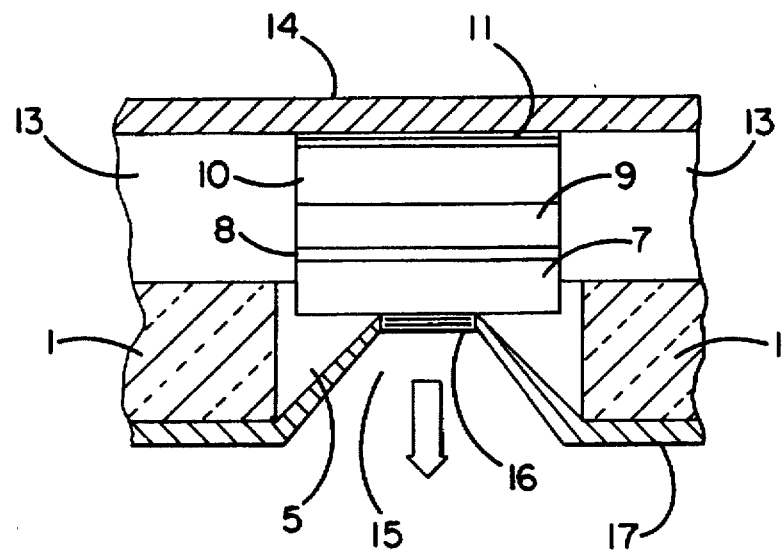
FIG. 4 is a cross-sectional view of a semiconductor laser structure according to a second embodiment of the present invention.

The structure of a second embodiment of a semiconductor laser according to the invention is illustrated in the cross-sectional view of FIG. 4. Unlike the structure of FIG. 1 in which the surface of the contact layer 5 on which the electrode 17 is disposed is parallel to the interfaces of the epitaxially grown layers, in the semiconductor laser of FIG. 4, that surface is oblique to those interfaces. Thus, the aperture 15 from which laser light is emitted converges toward the front light reflecting layer 16 and, for example, may have the shape of the surface of a frustrum of a cone. In this structure, the front light reflecting layer 16 is limited to the n-type cladding 7 and does not extend onto parts of the contact layer 5 as in the structure of FIG. 1. In addition, the electrode 17 extends onto the oblique surfaces of the contact layer 5, potentially increasing the area of contact and providing improved electrical characteristics because of reduced contact resistance.

A method for making the semiconductor laser of FIG. 4 is substantially the same as that illustrated in FIGS. 2(a)-2(l). However, in the step illustrated in FIG. 2(j), to form the oblique surfaces, the side surfaces of the aperture 15 are lapped from the surface of the sapphire substrate 1 to the n-type cladding layer 7. Thereafter, the front light reflecting layer 16 is formed and limited in extent either during or after formation using, for example, photolithography and etching, followed by deposition of the electrode 17 on the oblique surfaces of the contact layer 5. In this embodiment, the continuity of the surface of the sapphire substrate 1 and the contact layer 5 on which the electrode 17 is disposed, including a corner but free of step discontinuities, is ensured, providing simple and reliable electrical connection to the contact layer 5.

Figure 5:
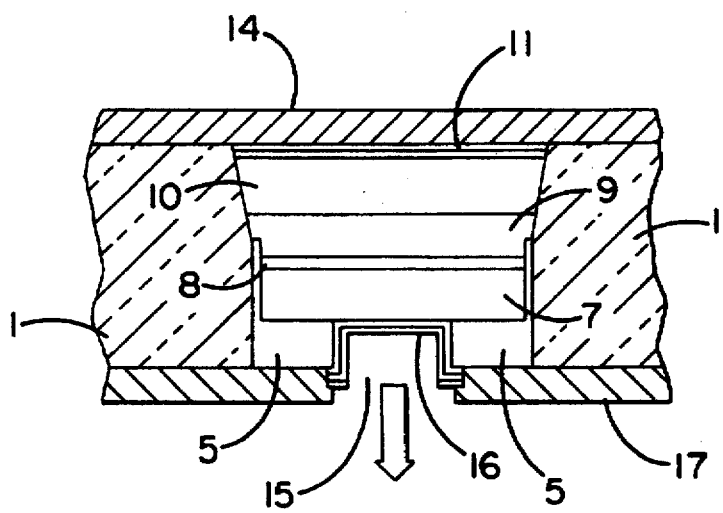
FIG. 5 is a cross-sectional view of a semiconductor laser structure according to a third embodiment of the present invention.

Still another embodiment of a semiconductor laser according to the invention is illustrated in a cross-sectional view in FIG. 5. In this structure, all of the side surfaces, i.e., lateral surfaces, of the epitaxially grown n-type cladding layer 7 and active layer 8 are covered by extensions of the contact layer 5. Part of the side surface of the p-type cladding layer 9 is also covered by an extension of the contact layer 5. The remainder of the side surface of the p-type cladding layer 9, the p-type contact layer 10, and the light reflecting layer 11 are contacted by the sapphire substrate 1. Otherwise, the structure of the semiconductor laser of FIG. 5 is the same as the structure of the semiconductor laser of FIG. 1.

Figure 6A:
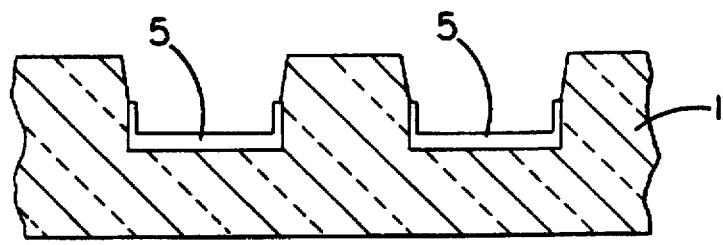
FIGS. 6(a)-6(d) are cross-sectional views illustrating a process for manufacturing the semiconductor laser of FIG. 5.

A method of manufacturing the semiconductor laser of FIG. 5 is illustrated in FIGS. 6(a)-6(d). The initial manufacturing steps are substantially the same as those illustrated in FIGS. 2(a)-2(e) so that repeated description of those steps is unnecessary. However, in this embodiment, the step illustrated in FIG. 2(c) is modified by making the recesses 4 deeper than those illustrated in FIG. 2(c). Further, in the steps of FIGS. 2(d) and 2(e), the protective films 2 are removed by lapping. Then, as illustrated in FIG. 6(a), part of the side surfaces at the recesses 4 are lapped to remove the contact layer 5 from those side surfaces. The contact layer 5 may be entirely removed from the side surfaces of the recesses 4 or it may be left, as illustrated in FIG. 6(a), extending along only part of those side surfaces from the bottoms of the recesses 4.

Figure 6B:
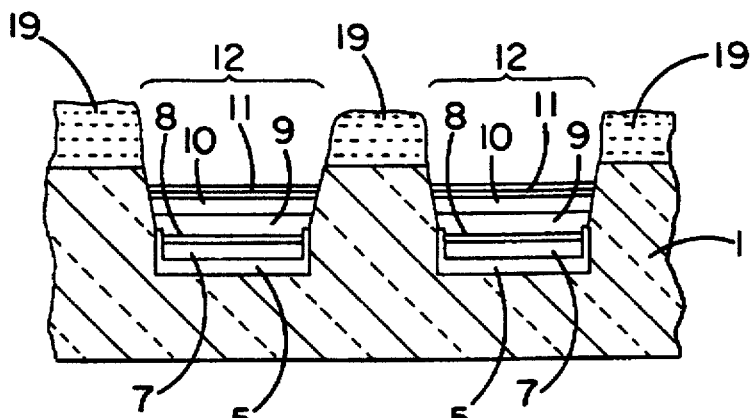

Next, as depicted in FIG. 6(b), the epitaxial layers are grown in regions 12, just as previously described. The epitaxial layers include the n-type cladding layer 7, the active layer 8, the p-type cladding layer 9, the p-type contact layer 10, and the rear light reflecting layer 11. These layers are grown on the remaining parts of the contact layer 5 and single crystal growth is limited to that area by employing the molecular beam epitaxy (MBE) process. In that process, in the regions outside the recesses 4, the deposited material 19 is polycrystalline. The amount of the contact layer 5 left on the side surfaces of the recesses 4 determines whether the contact layer 5 reaches and covers side surfaces of some or all of the epitaxially grown layers, including the p-type cladding layer 9.

Figure 6C:
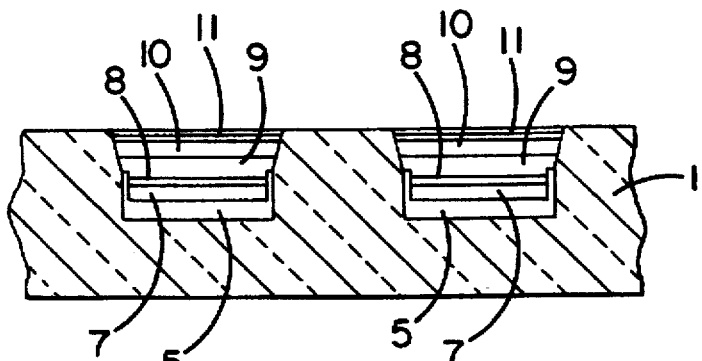
Figure 6D:
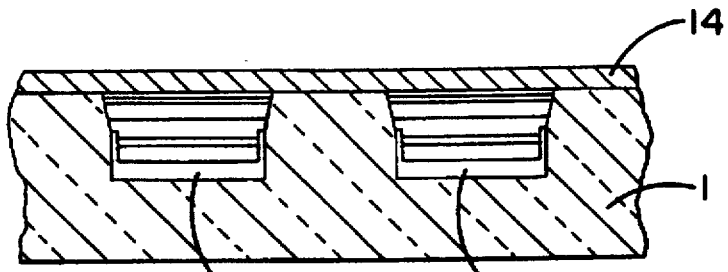

The front surface of the sapphire substrate 1 is lapped, as indicated in FIG. 6(c), so that the rear light reflecting layer 11 becomes substantially flush, i.e., coplanar, with the lapped surface of the sapphire substrate 1. In this lapping process, all of the polycrystalline material 19 is removed. Then, as shown in FIG. 6(d), the electrode 14 is formed on the lapped surface of the sapphire substrate 1 and on the regions 12 including the epitaxially grown layers. Thereafter, the manufacturing steps previously described with respect to FIGS. 2(i)-2(l) are carried out to complete the semiconductor laser structure illustrated in FIG. 5. Repeated description of those steps is unnecessary.

Since, in the semiconductor laser embodiment of FIG. 5, the sapphire substrate 1 directly or indirectly contacts the side surfaces of the epitaxially grown layers and has a much higher resistivity than the insulating layer 13 employed in the embodiment of FIG. 1, the current blocking function, limiting current flow to the epitaxial layers, is improved. The improved current blocking provides higher efficiency performance and better heat dissipation for the semiconductor laser, preventing anomalies in the laser oscillation produced when the temperature increases. Further, although not illustrated in FIG. 5, the contact layer 5 may have surfaces that are oblique to the surfaces of the sapphire substrate 1 rather than coplanar with at least one of those substrate surfaces, as illustrated in FIG. 5. Further, the sapphire substrate 1 may be replaced with MgO or spinel.

Figure 7:
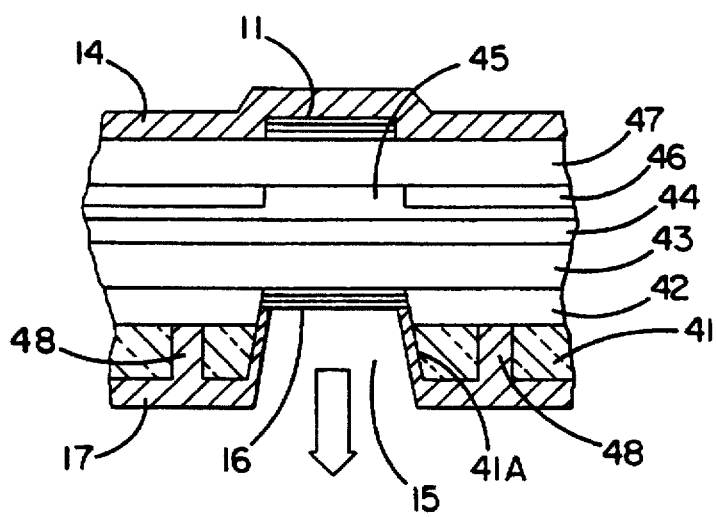
FIG. 7 is a cross-sectional view of a semiconductor laser structure according to a fourth embodiment of the present invention.
Figure 8:
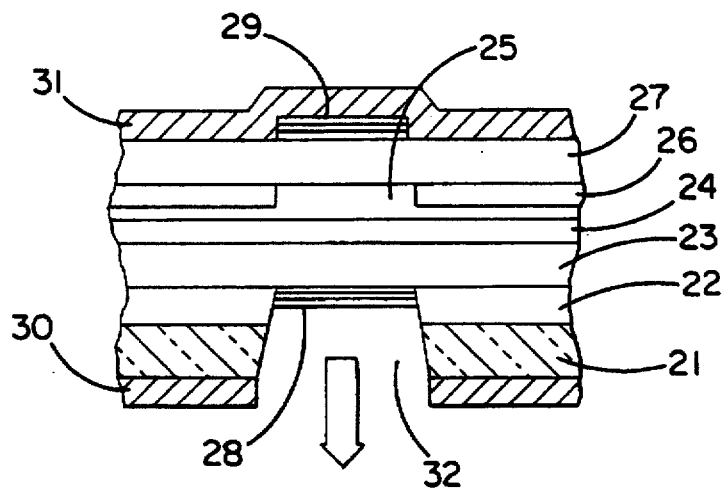
FIG. 8 is a cross-sectional view showing the structure of a semiconductor laser according to the prior art.
Figure 9:
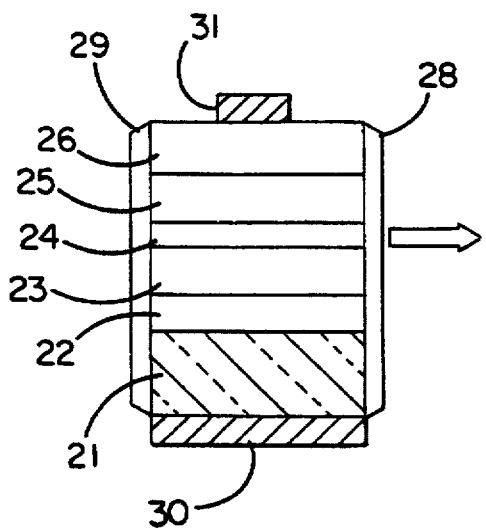
FIG. 9 is a cross-sectional views showing the structure of a semiconductor laser according to the prior art.

FIG. 7 is a cross-sectional view of a fourth embodiment of a semiconductor laser according to the invention. This semiconductor laser includes a sapphire substrate 41 including an opening 41A. A semiconductor laser structure includes laminated semiconductor layers disposed on the sapphire substrate 41 including an n-type GaN buffer layer 42, which also functions as a first contact layer, an n-type AlGaN cladding layer 43, an undoped GaInN active layer 44, a p-type AlGaN cladding layer 45, an n-type GaN current blocking layer 46, and a p-type GaN contact layer 47. These materials are epitaxially grown in the order listed. The current blocking layer 46 is not continuous but includes a central opening through which the p-type cladding layer 45 directly contacts the p-type contact layer 47. Thus, the current blocking layer 46 confines the flow of current between the electrodes 14 and 17 through a particular, central region of the semiconductor laser. An aperture 15 in the semiconductor laser includes the opening 41A in the sapphire substrate 41 and extends into and through the buffer layer 42 to expose a part of the n-type cladding layer 43. A front light reflecting layer 16 is disposed in the aperture 15 on the n-type cladding layer 43 directly opposite the central opening in the current blocking layer 46. Likewise, a rear light reflecting layer 11 is disposed on only a part of the contact layer 47 directly opposite the front light reflecting layer 16 and the aperture 15 in the sapphire substrate. Therefore, light generated within the semiconductor laser resonates between the front and rear light reflecting layers 16 and 11 and becomes laser light when the current flow exceeds a threshold current. The laser beam is emitted from the semiconductor laser through the front light reflecting film 16, as shown by the arrow in FIG. 7. Preferably, the light reflecting layers 11 and 16 and the opening in the current blocking layer 46 have the same shape and approximately the same size in plan view. The electrode 14 directly contacts the contact layer 47, is disposed on that layer, and covers the rear light reflecting layer 11. The electrode 17 is more complex and includes a portion lying on a surface of the sapphire substrate 41 and on surfaces of the substrate and of the buffer layer 42 in the aperture 15. Electrical contact is established in that aperture 15 between the electrode 17 and the buffer layer 42 that functions as a contact layer. However, to ensure reliable electrical contact, at least one hole 48 extends through the sapphire substrate 41 to the buffer layer 42 and that hole is filled with part of the electrode 17. The electrode 17 contacts the contact layer 47 through the hole 48.

The invention has been described with respect to certain preferred embodiments. Various modifications and additions within the spirit of the invention will occur to those of skill in the art. Accordingly, the scope of the invention is limited solely by the following claims.

We claim:
1. A semiconductor laser comprising:
an electrically insulating substrate having an opening;
a first conductivity type semiconductor first contact layer disposed within the opening in the electrically insulating substrate, contacting the electrically insulating substrate, and having an externally exposed surface;
a laminated semiconductor layer structure disposed on the first contact layer and comprising, successively disposed, a first conductivity type semiconductor first cladding layer, a semiconductor active layer, a second conductivity type semiconductor second cladding layer, and a second conductivity type semiconductor second contact layer wherein the first contact layer includes an aperture within the opening in the electrically insulating substrate in which a surface of the first cladding layer is exposed;
a first light reflecting layer disposed on the surface of the first cladding layer exposed in the aperture;
a second light reflecting layer disposed on the second contact layer opposite the first light reflecting layer;
a first electrode disposed on the electrically insulating substrate and extending to and contacting the first contact layer; and
a second electrode in electrical contact with the second contact layer.

2. The semiconductor laser according to claim 1 wherein the surface of the first contact layer exposed in the aperture is planar and substantially flush with a surface of the electrically insulating substrate.

3. The semiconductor laser of claim 1 wherein the externally exposed surface of the first contact layer is oblique to a planar surface of the electrically insulating substrate.

4. The semiconductor laser of claim 1 including a second electrically insulating layer disposed between the electrically insulating substrate and the second electrode, contacting a side surface of the laminated semiconductor layer structure.

5. The semiconductor laser of claim 1 wherein the electrically insulating substrate extends to the second electrode, confining and contacting at least part of a side surface of the laminated semiconductor layer structure.

6. The semiconductor laser of claim 5 wherein the first contact layer extends along and contacts side surfaces of at least some of the layers of the laminated semiconductor layer structure.

7. The semiconductor laser of claim 1 wherein the first and second contact layers, the first and second cladding layers, and the active layer are gallium nitride materials.

8. The semiconductor laser of claim 1 wherein the electrically insulating substrate is selected from the group consisting of sapphire, MgO, and spinel.

9. A semiconductor laser comprising:
an electrically insulating substrate having an opening;
a first conductivity type semiconductor first contact layer disposed on and contacting the electrically insulating substrate;
a laminated semiconductor layer structure disposed on the first contact layer and comprising, successively disposed, a first conductivity type semiconductor first cladding layer, a semiconductor active layer, a second conductivity type semiconductor second cladding layer, a first conductivity type semiconductor current blocking layer having a central opening filled by part of the second cladding layer, the opening being disposed opposite the opening in the electrically insulating substrate, and a second conductivity type second contact layer wherein the first contact layer includes an aperture within the opening in the electrically insulating substrate in which the first cladding layer is exposed;

a first light reflecting layer disposed on the first cladding layer in the aperture in the first contact layer;

a second light reflecting layer disposed on the second contact layer opposite the first light reflecting layer;

a first electrode disposed on the electrically insulating substrate in the opening and extending to and contacting the first contact layer in the aperture; and a second electrode disposed on and contacting the second contact layer.

10. The semiconductor laser according to claim 9 wherein the aperture includes side surfaces oblique to a planar surface of the electrically insulating substrate, a surface of the first contact layer is exposed in the aperture, and the first electrode extends on the oblique side surface contacting the first contact layer.

11. The semiconductor laser of claim 9 wherein the electrically insulating substrate includes at least one hole extending through the substrate to the first contact layer and wherein part of the first electrode fills the hole in the electrically insulating substrate, contacting the first contact layer.

12. The semiconductor laser of claim 9 wherein the first and second contact layers, the first and second cladding layers, and the active layer are gallium nitride materials.

13. The semiconductor laser of claim 9 wherein the substrate is selected from the group consisting of sapphire, MgO, and spinel.

* * * * *